(12) United States Patent
Wagner et al.

(10) Patent No.: US 7,613,064 B1
(45) Date of Patent: Nov. 3, 2009

(54) POWER MANAGEMENT MODES FOR MEMORY DEVICES

(75) Inventors: Barry A. Wagner, San Jose, CA (US);
Andrew R. Bell, San Francisco, CA (US); Thomas E. Dewey, Menlo Park, CA (US); Russell R. Newcomb, Morgan Hill, CA (US)

(73) Assignee: nVidia Corporation, Santa Clara, CA (US)

( * ) Notice: Subject to any disclaimer, the term of this patent is extended or adjusted under 35 U.S.C. 154(b) by 331 days.

(21) Appl. No.: 11/612,919

(22) Filed: Dec. 19, 2006

(51) Int. Cl.
*G11C 5/14* (2006.01)

(52) U.S. Cl. .................. 365/227; 365/222; 365/233

(58) Field of Classification Search .............. 365/227, 365/222, 233, 194, 226, 230.01, 191, 189.08, 365/185.22, 89
See application file for complete search history.

(56) References Cited

U.S. PATENT DOCUMENTS

| | | | | |
|---|---|---|---|---|
| 6,266,294 B1* | 7/2001 | Yada et al. | .............. | 365/233.14 |
| 7,343,502 B2* | 3/2008 | Samson et al. | .............. | 713/320 |
| 7,425,150 B1* | 9/2008 | Stefanoski | ................. | 361/698 |
| 2001/0012230 A1* | 8/2001 | Takemae et al. | ............. | 365/222 |
| 2004/0174760 A1* | 9/2004 | Lim et al. | .................. | 365/222 |
| 2005/0195674 A1* | 9/2005 | Jang | .......................... | 365/222 |

* cited by examiner

*Primary Examiner*—Dang T Nguyen
(74) *Attorney, Agent, or Firm*—Berkeley Law & Technology Group, LLP

(57) ABSTRACT

Embodiments of power management modes for memory devices are disclosed.

19 Claims, 4 Drawing Sheets

POWER MANAGEMENT MODES FOR MEMORY DEVICES

BACKGROUND

This disclosure is related to memory devices that may be employed within computing platforms.

Computing platforms may include one or more dynamic random access memory (DRAM) devices. DRAM devices may be used in a variety of applications, including main system memory and/or graphics memory, to list a couple of examples. For some computing platforms, one or more DRAM devices may be coupled to a graphics processing unit (GPU). The GPU may be located on a motherboard for some platforms, and for other platforms the GPU may be located on an adapter card.

A DRAM device comprises volatile memory, and accordingly, a device charge must periodically be refreshed. For example, memory bank charge of a DRAM device may be refreshed in approximately 64 ms or less, in accordance with Joint Electron Device Engineering Council (JEDEC) standards. A DRAM device may employ integrated refresh and timing logic to perform refresh functions, and/or may employ refresh and timing logic of a computing platform to perform refresh functions, for example. Typically, DRAM devices may employ a power management mode such as a self-refresh mode. A self-refresh mode may be enabled when a DRAM device is not actively being used, for example. In a self-refresh mode, DRAM charge is periodically refreshed by employing integrated DRAM refresh logic. DRAM devices may periodically enter and exit modes such as self-refresh mode. Typically, delays may be incurred when exiting modes such as a self-refresh mode, due at least in part, to a time delay that may be incurred to synchronize or relock the DRAM device with a computing platform clock, for example.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

DETAILED DESCRIPTION

Figure 1:
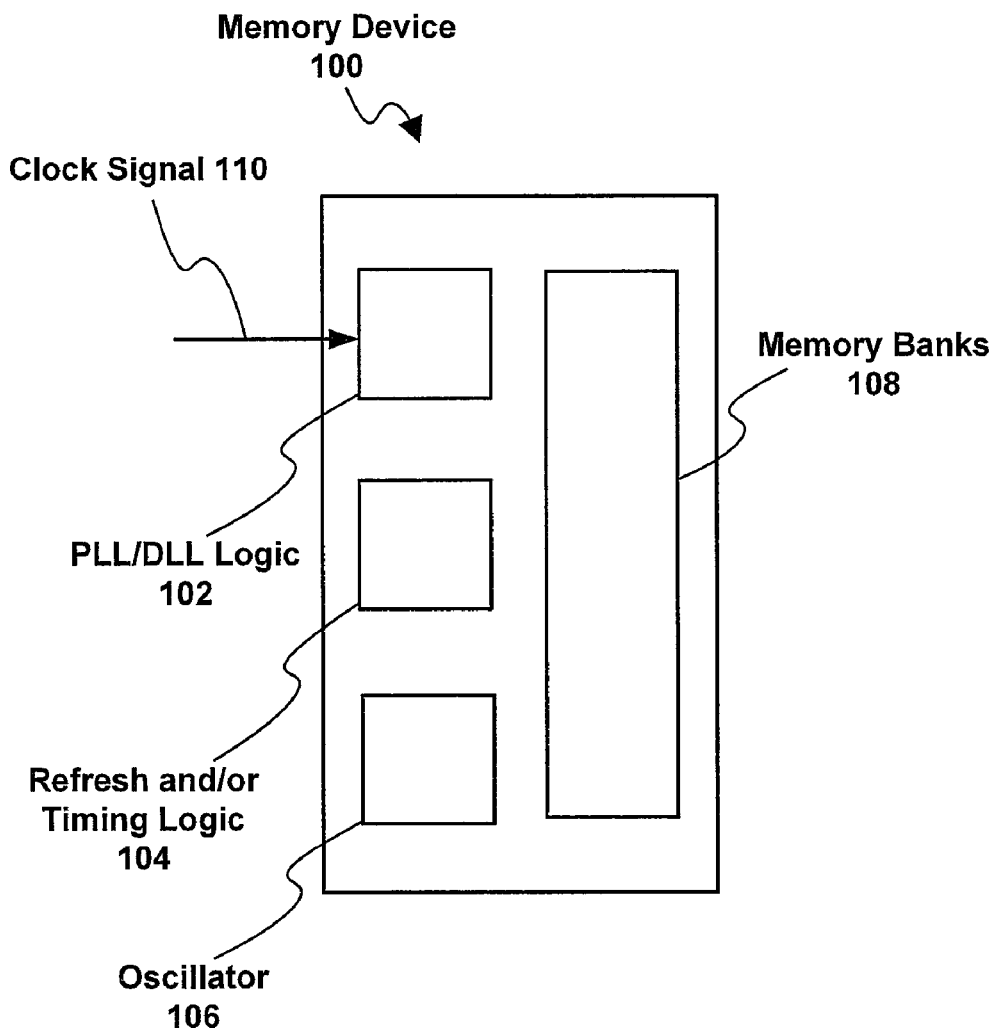
FIG. 1 is a block diagram of an example embodiment of a memory device that may employ power management modes, in accordance with at least one embodiment.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

"Logic" as referred to herein relates to structure for performing one or more logical operations. For example, logic may comprise circuitry which provides one or more output signals based at least in part on one or more input signals. Such circuitry may comprise a finite state machine which receives a digital input signal and provides a digital output signal, or circuitry which provides one or more analog output signals in response to one or more analog input signals. Such circuitry may be provided, for example, in an application specific integrated circuit (ASIC) and/or a field programmable gate array (FPGA). Also, logic may comprise machine-readable instructions stored in a storage medium in combination with a processor or other processing circuitry to execute such machine-readable instructions. However, these are merely examples of structures which may provide logic and claimed subject matter is not limited in these respects.

Unless specifically stated otherwise, as apparent from the following discussion, it is appreciated that throughout this specification discussions utilizing terms such as "processing," "computing," "calculating," "selecting," "enabling," "identifying," "initiating," "obtaining," "maintaining," "representing," "modifying," "receiving," "transmitting," "storing," "determining" and/or the like refer to the actions and/or processes that may be performed by a computing platforms such as a computer or a similar electronic computing device, that manipulates and/or transforms data represented as physical, electronic and/or magnetic quantities and/or other physical quantities within the computing platform's processors, memories, registers, and/or other information storage, transmission, reception and/or display devices. Accordingly, a computing platform refers to a system or a device that includes the ability to process and/or store data in the form of signals. Thus, a computing platform, in this context, may comprise hardware, software, firmware and/or any combination thereof. Further, unless specifically stated otherwise, a process as described herein, with reference to flow diagrams or otherwise, may also be executed and/or controlled, in whole or in part, by a computing platform.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other.

FIG. 1 is a block diagram of an example embodiment of a memory device 100. Memory device 100 may employ power management modes in accordance with one or more embodiments. For this example embodiment, memory device 100 comprises a DRAM device, although the scope of the claimed subject matter is not limited in this respect, and may comprise any type of volatile memory, even though they may not be described in detail. Also for this example embodiment, memory device 100 may comprise a double data rate (DDR) DRAM device, although, again, the scope of the claimed subject matter is not limited in this respect. In this example, memory device 100 includes locking logic, such as PLL and/or DLL logic 102 for locking on to a computing platform clock signal. Memory device 100 further includes a PLL and/or DLL controller (not shown), refresh and/or timing logic 104, oscillator 106 and memory banks 108, for example. Additionally, although not illustrated, memory device 100 may comprise a memory controller, input/output (I/O) buffers and/or a temperature sensor. In operation, a charge of memory banks 108 may periodically be refreshed. Refreshing may be controlled by refresh and/or timing logic 104 and/or oscillator 106 in at least one embodiment. Alternatively, refreshing may be controlled via clock signal 110, provided by a computing platform clock (not shown), external to memory device 100.

Memory device 100 may be capable of receiving a clock signal 110, which may be provided from an external source, such as a computing platform (not shown). Memory devices such as these may employ locking logic to lock on to a computing platform clock signal, and/or may employ computing platform clock signals to coordinate memory device operations, such as reading and/or writing data, refreshing memory bank charge, and other functions not described in detail. Additionally, other signals not described in detail may be employed by memory device in at least one embodiment. For example, other signals may be employed for one or more of the functions described herein, including, but not limited to, bank address signals, data mask signals, various command signals, and the like. Further, although the example embodiments herein discuss the use of DDR DRAM devices, other embodiments are possible using other volatile memory device types, for example DDR2, DDR3, DDR4 and/or GDDR5 DRAM devices. Furthermore, in this context, with reference to a computing platform clock, the terms locking and synchronizing may be used interchangeably. Embodiments of the claimed subject matter set forth herein are possible using any volatile memory device technology that employs power management modes.

Memory devices such as memory device 100 may employ a variety of power management modes. For example, power management modes may be employed to manage, reduce and/or limit power consumption of one or more portions of the memory device 100. For example, memory device 100 may employ a self-refresh mode, wherein memory bank charge of memory banks 108 may periodically be refreshed. Refreshing may be controlled by refresh and/or timing logic 104 and/or oscillator 106 in self-refresh mode. Self-refresh mode may provide the benefit of reducing power consumption by enabling the power-down of PLL/DLL logic 102 and/or other components of memory device 100 not described in detail, such as input/output buffers, for example. However, in self-refresh mode, read and/or write operations are typically not enabled. Accordingly, it may be desirable to periodically exit self-refresh mode. However, exiting self-refresh mode may require PLL/DLL logic to relock to a computing platform clock. A time delay for relocking with a computing platform clock may be incurred, and may be on the order of 10,000 to 20,000 computing platform clock cycles, 5,000 to 10,000 clock cycles or 3,000 to 5,000 clock cycles depending on the particular configuration of memory device 100, one or more components thereof and/or a particular computing platform, although the claimed subject matter is not limited in this respect.

Depending at least in part on the particular application, a time delay for relocking PLL/DLL logic with a computing platform clock may result in undesirable effects. In particular applications, such as graphics applications, it may be desirable to provide a method and/or apparatus to enter and/or exit a power management mode in a relatively fast manner. For example, a memory device may be employed as part of a graphics card of a computing platform. It may be desirable to enable the memory device to enter and/or exit a self-refresh mode faster than the time delay noted previously. For example, in one embodiment, it may be desirable to enter and/or exit a self-refresh mode within approximately 500 to 2,000 clock cycles. In an alternative embodiment, it may be desirable to enter and/or exit a self-refresh mode within approximately 500 clock cycles or less. However, it is worthwhile to note that these are just example embodiments, and the claimed subject matter is not limited in this respect. In one embodiment of the claimed subject matter, a method and/or apparatus of exiting a self-refresh mode may be provided wherein a reduced time delay to relock to a computing platform clock may be incurred upon exiting a self-refresh mode. However, particular embodiments will be described in more detail hereinafter.

Figure 2:
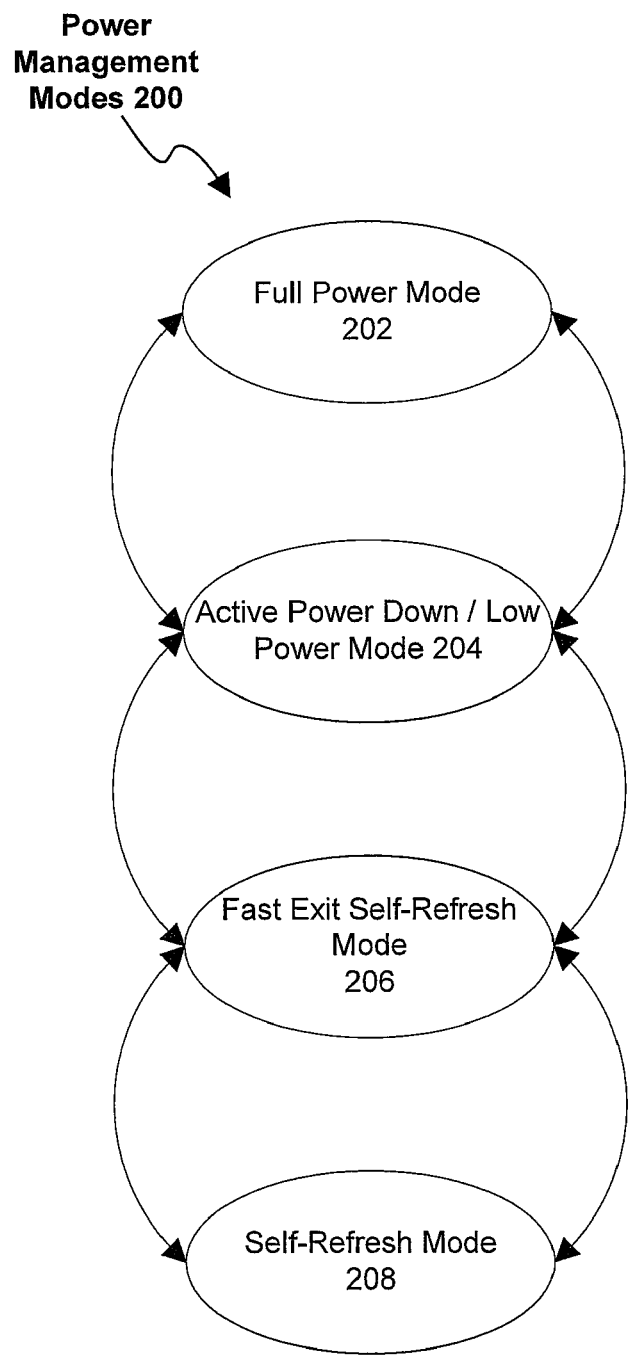
FIG. 2 is a schematic diagram illustrating power management modes that may be employed in one or more embodiments.

As mentioned previously, memory device 100 may be capable of operating in several power management modes. The modes may be selected and/or enabled by signals provided to the memory by a computing platform, for example. FIG. 2 depicts a plurality of power management modes 200 that may be employed by a memory device in accordance with one or more embodiments. Full power mode 202 may be utilized by a memory device when the device is fully operational. For example, in full power mode 202, a memory device may be ready to perform reading and/or writing functions, and may have all memory banks and/or other components active, for example. In full power mode 202, a memory device may be synchronized with a computing platform clock by having locking logic such as PLL/DLL logic locked to a computing platform clock. Full power mode 202 may be employed by a memory device when it may be desirable to eliminate delays and/or incur reduced delays when utilizing portions of the memory device, and/or when power conservation may not be particularly desirable, for example.

Active power down/low power mode 204 may comprise another power management mode utilized by a memory device. In this mode, a memory device may be locked to a computing platform clock, but may not have all memory banks active. This mode may be employed when reading and/or writing operations are not actively being performed, but delays to perform these functions may not be desired, for example. In this mode, a memory device may be synchronized with a computing platform clock by having PLL/DLL logic locked to the computing platform clock. In active power down/low power mode 204, power consumption may be reduced as compared with full power mode 202, due at least in part to fewer than all memory banks being active, for example. Accordingly, delays may be incurred when exiting this mode and entering full power mode 202, but may be relatively short, for example. In active power down/low power mode 204, periodic refresh of memory bank charge may be managed by one or more portions of a computing platform.

Self-refresh mode 208, as described previously, may comprise a power management mode wherein a memory device may have DLL/PLL logic and/or other components such as input/output buffers powered down. Additionally, in self-refresh mode 208, a memory device may perform functions including periodic charge refresh via internal refresh and/or timing logic, for example. Self-refresh mode 208 may consume less power than active power down/low power mode 204 and full power mode 202, due at least in part to having one or more components powered down, for example. However, as mentioned previously, a delay may be incurred when exiting this mode and entering one or more of full power mode 202 and/or active power down/low power mode 204, due at least in part to the time required to activate one or more memory banks and/or relock DLL/PLL logic to a computing platform clock.

Continuing with FIG. 2, fast exit self-refresh mode 206 comprises another power management mode that may be employed by a memory device. Fast exit self-refresh mode 206 may be employed by a memory device when it is desirable to exit and/or enter a self-refresh mode without incurring the same delays associated with self-refresh mode 208, for example. In this mode, a memory bank charge may be periodically refreshed via internal refresh and/or timing logic. Alternatively, charge may be periodically refreshed via external refresh and/or timing logic, although the claimed subject matter is not limited to any particular manner of refreshing memory bank charge. Furthermore, in this mode, and in one embodiment, DLL/PLL logic may remain at least partially powered, such that the DLL/PLL logic may maintain partial synchronization with a computing platform clock. For example, in operation, in fast self refresh exit mode 206, a DLL/PLL controller and/or a memory controller may be employed to reduce power to DLL/PLL logic by a specified amount or within a specified range, rather than powering DLL/PLL logic down, such as in self-refresh mode 208. The specified range may comprise a percentage reduction of power, may comprise a reduction of power that correlates with a specified timing error between a computing platform clock and DLL/PLL logic, and/or other parameters, but the claimed subject matter is not so limited. Additionally, power may be reduced to PLL/DLL logic to reduce synchronization between the PLL/DLL logic and a computing platform clock within a specified range. The specified range may comprise a timing error range, or a percentage reduction in timing synchronization, but the claimed subject matter is not so limited. As one example embodiment of fast exit self-refresh mode 206, power may be reduced to PLL/DLL logic by 50% as compared with modes 202 and 204, and timing between PLL/DLL logic may be partially maintained. Accordingly, power savings as compared to modes 202 and 204 may be incurred, while still providing faster exit latency than self-refresh mode 208. This may be due at least in part to requiring less time to relock to a computing platform clock upon exiting fast exit self-refresh mode 206, for example.

In an alternative embodiment, in fast exit self-refresh mode 206, a DLL/PLL controller and/or memory controller may power down DLL/PLL logic, and may periodically power up DLL/PLL logic briefly in order to adjust and/or correct synchronization between an internal clock and a computing platform clock. This may result in reduced power consumption as compared with full power mode 202 and/or active power down/low power mode 204, and a faster exit time that self-refresh mode 206. As one example embodiment of fast exit self-refresh mode 206, power may be reduced to PLL/DLL logic as compared with modes 202 and 204, and timing synchronization between PLL/DLL logic may be partially maintained. Accordingly, power savings as compared to modes 202 and 204 may be incurred, while still providing faster exit latency than self-refresh mode 208.

In another alternative embodiment, when in fast exit self-refresh mode 206, lock data may be obtained from a DLL/PLL controller and/or DLL/PLL logic and stored prior to powering down the DLL/PLL logic. Lock data may comprise a previously locked setting of locking logic, and may be stored in a register of a memory device, for example. Lock data may comprise an encoded representation of delay taps of DLL logic or an encoded representation of current charge of PLL logic, as just a few examples, but other types of lock data or data representative of a previously locked setting may be stored in alternative embodiments. In this embodiment, when DLL/PLL logic is powered up, the stored lock data may be employed to relock the DLL/PLL logic with a computing platform clock, for example. In one embodiment, relocking may not result in a time delay, if the lock data correlates with a computing platform clock upon power up. However, factors including temperature drift of one or more portions of a memory device, such as DLL/PLL logic and/or temperature drift of a computing platform may result in stored lock data and a computing platform clock not correlating, or being offset with respect to one another. In this embodiment, a delay may be incurred when lock data is employed to relock with a computing platform clock. Alternatively, a temperature sensor that may be disposed on a memory device and/or a computing platform may be employed to approximate or determine temperature drift of DLL/PLL logic, for example. In this embodiment, temperature drift, and/or an offset associated with a temperature drift may be employed to alter the stored lock data, such that a reduced delay may be incurred when relocking with a computing platform clock. Accordingly, power savings as compared to modes 202 and 204 may be incurred, while still providing faster exit latency than self-refresh mode 208.

In yet another alternative embodiment, when in fast exit self-refresh mode 206, lock data may be obtained from a DLL/PLL controller and/or DLL/PLL logic and stored prior to powering down the DLL/PLL logic. In this embodiment, a particular platform voltage may be employed for one or more portions of a memory device and/or a computing platform. For example, a voltage of 1.8 volts may be employed for a particular DRAM device. A dynamic voltage change may be employed such as to alter the voltage of a memory device. In this embodiment, when in fast exit self-refresh mode 206, a dynamic voltage change may be employed while DLL/PLL logic is in a powered down state. For example, a voltage of a memory device may be adjusted from 1.8 volts to 1.5 volts. In this embodiment, the stored lock data may be altered based at least in part on the adjusted voltage, such that the lock data may more closely correlate with a computing platform clock. Accordingly, a reduced delay may be incurred when relocking DLL/PLL logic with a computing platform clock. In this embodiment, power savings as compared to modes 202 and 204 may be incurred, while still providing faster exit latency than self-refresh mode 208.

Continuing with this embodiment, exiting of fast exit self-refresh mode 206 may be performed by activating one or more components of a memory device that may have been powered down. For example, in order to exit fast self-refresh mode 206, power may be provided to one or more memory banks, and, depending on the particular configuration of fast exit self-refresh mode 206, computing platform refresh of the memory banks may be enabled. Additionally, depending at least in part on the partial synchronization maintained with a computing platform clock, time delay may be incurred to correct synchronization and/or relock with a computing platform clock. Upon exiting fast exit self-refresh mode 206, a memory device may enter one or more of the modes 202, 204 or 208, for example.

Figure 3:
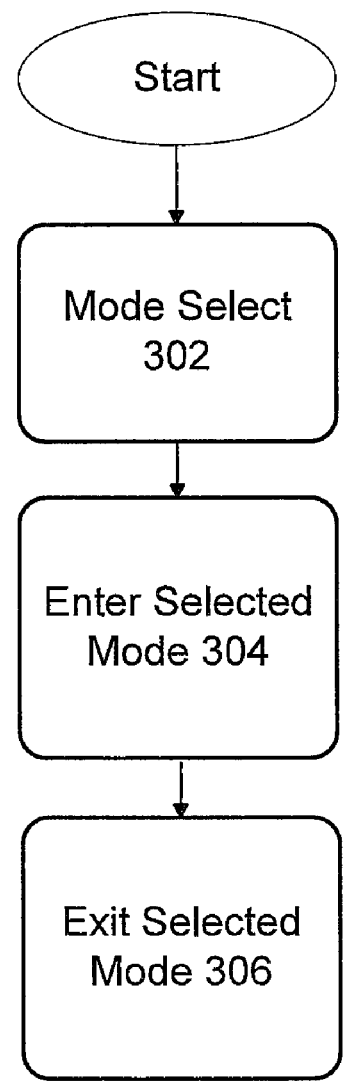
FIG. 3 is a block diagram illustrating a method of power management that may be employed by a memory device, in accordance with at least one embodiment.

FIG. 3 illustrates a flow diagram 300 of an example embodiment of a method of power management that may be employed by a memory device. However, for flow diagram 300, the order in which the blocks are presented does not necessarily limit claimed subject matter to any particular order, and may comprise fewer operations or additional intervening, substitute, or subsequent operations. Flow diagrams depicted herein may, in alternative embodiments, be implemented in a combination of hardware, software and/or firmware, such as part of a computer platform. The functionality of flow diagram 300 may be executed manually, such as by a user, and/or may be executed by a software application and/or hardware, for example.

In this embodiment, at block 302, a power management mode is selected. Selection may be performed in response to a condition of a computing platform, such as in response to a computing platform being in an active state and/or particular functions of a computing platform being in an active state. Alternatively, a power management mode may be selected manually. A mode may be selected by enabling a data bit residing on a portion of a computing platform. The data bit may comprise a mode bit that may enable one or more modes. The mode bit may be set in a mode register set (MRS) cycle of a computing platform, for example. In one embodiment, a mode bit may enable a fast self-refresh exit mode, such as fast self-refresh exit mode 206 of FIG. 2. Accordingly, at block 304, when a memory device enters self-refresh mode, DLL/PLL logic may at least partially maintain a lock with a computing platform clock, by reducing power to DLL/PLL logic, by periodically powering up DLL/PLL logic, and/or by storing and/or adjusting lock data, such as described in connection with one or more of the embodiments disclosed herein, for example. At block 306, when a memory device exits a fast self-refresh exit mode, a time delay to relock to a computing platform clock may be reduced. As an example, in at least one embodiment of a fast self-refresh exit mode, DLL/PLL logic may be synchronized with a computing platform clock within less than approximately 500 clock cycles, although this is just one example, and the claimed subject matter is not limited in this respect.

Figure 4:
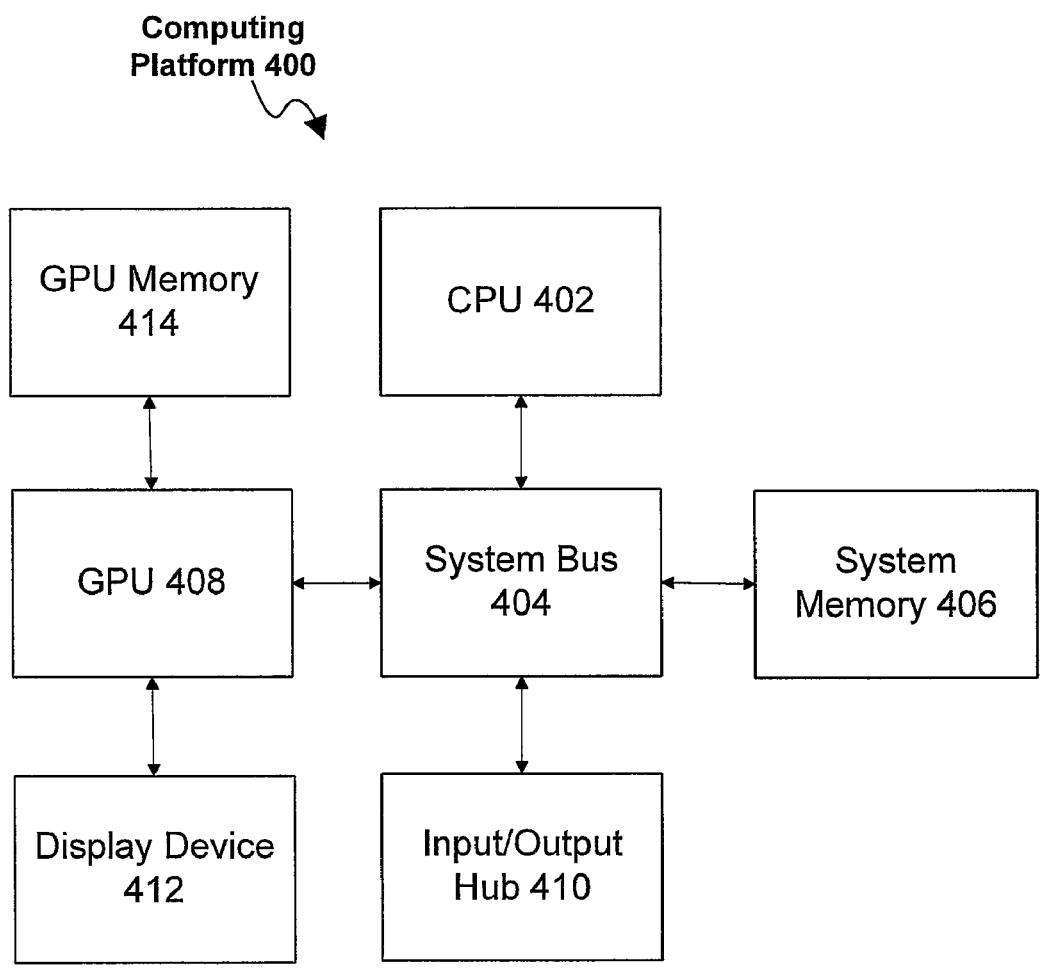
FIG. 4 is a block diagram of an example embodiment of a computing platform.

FIG. 4 is a block diagram of an example embodiment of a computing platform 400 that may employ power management modes in accordance with one or more of the previously described embodiments. Computing platform 400 may comprise a central processing unit (CPU) 402, and a system bus 404 coupled to CPU 402. System bus 404 may be further coupled to a system memory 406. System memory 406 may comprise one or more types of memory, such as DRAM memory, for example. In operation, system memory 406 may be capable of employing multiple power management modes, and at least one mode may comprise a fast exit self-refresh mode, for example. System bus 404 may be further coupled to a GPU 408, and/or to an input/output hub 410. GPU 408 may be further coupled to a display device 412, which may comprise a liquid crystal display (LCD), a projector or a cathode-ray tube (CRT) display, for example. Also coupled to GPU 408 is a GPU memory 414, which may be formed integrally with GPU 408 on a PCB, or may be physically separate from GPU 408, for example. Computing platform 400 may also comprise one or more storage medium reading devices (not shown), which may be coupled to input/output hub 410, for example.

Although example computing platform 400 is shown with a particular configuration of components, other embodiments are possible using any of a wide range of configurations. For example, embodiments are possible where a plurality of CPUs and/or GPUs are employed, and/or one or more types of memory, such as DRAM memory comprising one or more of DDR, DDR2, DDR3, DDR4, GDDR5, as just a few examples. Further, the example embodiments described herein may be used in any of a wide range of electronic devices, such as those described previously. Furthermore, computing platform 400 may include assemblies and/or components described with reference to any of the previously described embodiments, such as a graphics card in accordance with one or more of the aforementioned embodiments.

In the preceding description, various aspects of the claimed subject matter have been described. For purposes of explanation, specific numbers, systems and/or configurations were set forth to provide a thorough understanding of the claimed subject matter. However, it should be apparent to one skilled in the art having the benefit of this disclosure that the claimed subject matter may be practiced without the specific details. In other instances, well-known features were omitted and/or simplified so as not to obscure the claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of the claimed subject matter.

The invention claimed is:

1. A memory device, comprising:
one or more memory banks;
timing logic to periodically perform self-refresh of said one or more memory banks;
locking logic to at least partially maintain synchronization between an internal clock of the memory device and an external clock during performance of first and second modes, wherein said self-refresh is performed during said second mode; and
a locking logic controller to control one or more portions of said locking logic, wherein said locking logic controller is adapted to reduce an amount of power supplied to the locking logic during said performance of said self-refresh.

2. The memory device of claim 1, wherein the timing logic further comprises timing and control logic embodied on the memory device.

3. The memory device of claim 1, wherein the locking logic comprises one of delay locked loop (DLL) logic and phase locked loop (PLL) logic.

4. The memory device of claim 1, wherein at least partially maintaining synchronization comprises periodically powering up the locking logic to synchronize the internal clock and the external clock.

5. The memory device of claim 1, wherein at least partially maintaining synchronization comprises reducing power to the locking logic such that synchronization between said internal clock and said external clock is reduced to within a specified range.

6. The memory device of claim 1, wherein at least partially maintaining synchronization comprises storing lock data, wherein the lock data comprises a previously locked synchronization value.

7. The memory device of claim 6, wherein at least partially maintaining synchronization comprises adjusting the locking data based, at least in part, on one or more of a temperature drift or a voltage change of said memory device.

8. The memory device of claim 1, wherein the memory device comprises dynamic random access memory (DRAM).

9. A system, comprising:
a computing platform;
a processor coupled to the computing platform; and
a dynamic random access memory (DRAM) device coupled to the computing platform, the DRAM device comprising:
one or more memory banks;
timing logic to periodically perform self-refresh of said one or more memory banks;

locking logic to at least partially maintain synchronization between an internal clock of the memory device and an external clock during performance of first and second modes, wherein said self-refresh is performed during said second mode; and a locking logic controller to control one or more portions of said locking logic wherein said locking logic controller is adapted to reduce an amount of power supplied to the locking logic during said performance of said self-refresh.

10. The system of claim 9, wherein said processor comprises a graphics processing unit (GPU).

11. The system of claim 9, wherein the locking logic comprises one of delay locked loop (DLL) logic and phase locked loop (PLL) logic.

12. The system of claim 9, wherein the locking logic controller is further adapted to periodically power up the locking logic to synchronize the internal clock and the external clock.

13. The system of claim 9, wherein the locking logic controller is further adapted to reduce power to locking logic such that synchronization between said internal clock and said external clock is reduced to within a specified range.

14. The system of claim 9, wherein at least partially maintaining synchronization comprises storing lock data, wherein the lock data comprises a previously locked synchronization value.

15. The system of claim 9, further comprising a mode bit to enable selection of one or more functions of said locking logic controller.

16. A method, comprising:

Enabling a self-refresh mode for a memory device, wherein synchronization between an internal clock of the memory device and an external clock is at least partially maintained by locking logic, wherein an amount of power supplied to the locking logic is reduced during said self-refresh mode, wherein at least partially maintaining synchronization comprises:

storing lock data, wherein the lock data comprises a previously locked synchronization value of the locking logic of the memory device; and adjusting the lock data based, at least in part, on one or more of a temperature drift or a voltage change of said memory device.

17. The method of claim 16, wherein enabling a self-refresh mode for a memory device comprises setting a mode bit.

18. The method of claim 16, wherein at least partially maintaining synchronization comprises:

periodically providing power to locking logic of the memory device to synchronize the internal clock and the external clock.

19. The method of claim 16, wherein at least partially maintaining synchronization comprises:

reducing power to locking logic of the memory device such that synchronization between said internal clock and said external clock is reduced within a specified range.

\* \* \* \* \*